US008378436B2

(12) United States Patent
Ezaki

(10) Patent No.: US 8,378,436 B2
(45) Date of Patent: Feb. 19, 2013

(54) ELECTROMECHANICAL TRANSDUCER AND METHOD OF MANUFACTURING THE SAME

(75) Inventor: Takahiro Ezaki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 24 days.

(21) Appl. No.: 12/915,133

(22) Filed: Oct. 29, 2010

(65) Prior Publication Data

US 2011/0115333 A1 May 19, 2011

(30) Foreign Application Priority Data

Nov. 17, 2009 (JP) ................................ 2009-261592

(51) Int. Cl.
*H01L 29/82* (2006.01)

(52) U.S. Cl. .......................... 257/416; 310/300; 29/825

(58) Field of Classification Search .................. 257/416; 310/300; 29/825
See application file for complete search history.

(56) References Cited

U.S. PATENT DOCUMENTS

| | | | |
|---|---|---|---|
| 6,114,798 | A | 9/2000 | Maruyama et al. |
| 6,291,932 | B1 | 9/2001 | Maruyama et al. |
| 6,668,437 | B1 | 12/2003 | Maruyama et al. |
| 6,951,048 | B2 | 10/2005 | Maruyama et al. |

OTHER PUBLICATIONS

Xuefeng Zhu8ang, "Fabrication of Flexible Transducer Arrays With Through-Wafer Electrical Interconnects Based on Trench Refilling With PDMS", Journal of Microelectromechanical Systems, Apr. 2008, pp. 446-452, vol. 17, No. 2.

*Primary Examiner* — Long Pham
(74) *Attorney, Agent, or Firm* — Fitzpatrick, Cella, Harper & Scinto

(57) ABSTRACT

An electromechanical transducer includes a plurality of devices each including at least one cell including a first electrode and a second electrode facing each other across a gap, and an outer frame extending along an outer periphery of the plurality of devices. The first electrode of each of the devices includes a plurality of portions formed by electrically separating a device substrate with grooves, and the outer frame includes a part of the device substrate surrounding the plurality of portions and electrically separated from the plurality of portions by the grooves. The first electrodes each including the plurality of portions are respectively bonded to a plurality of conductive portions of another substrate via a plurality of electrode connection portions, and the outer frame is bonded to a corresponding portion of the another substrate via a circular outer frame connection portion which surrounds the electrode connection portions.

6 Claims, 4 Drawing Sheets

ELECTROMECHANICAL TRANSDUCER AND METHOD OF MANUFACTURING THE SAME

BACKGROUND OF THE INVENTION

1. Field of the Invention

The present invention relates to an electromechanical transducer such as an ultrasound transducer, and to a method of manufacturing the electromechanical transducer.

2. Description of the Related Art

A capacitive micromachined ultrasound (ultrasonic) transducer (CMUT) is a form of an electromechanical transducer. An example of CMUTs is constructed by electrically connecting a circuit board to a device substrate having multiple devices which include: a substrate having a lower electrode; a membrane, i.e., a vibration film supported by a supporter that is formed on the substrate having a lower electrode; and an upper electrode. Between the substrate having a lower electrode and the membrane, a cavity which is a gap is formed. The CMUT applies a voltage between the lower electrode and the upper electrode to cause the membrane to vibrate and thereby transmit ultrasound waves. The CMUT also receives ultrasound waves, which vibrate the membrane, and detects the ultrasound waves from a change in capacitance between the lower electrode and the upper electrode.

Conventional CMUTs are manufactured by utilizing so-called surface micromachining (surface type) or bulk micromachining (bonding type). A wiring method has been proposed in which multiple membranes and cavities on a silicon substrate constitute one device and the device is connected to a circuit board, with the silicon substrate itself serving as a lower electrode and as through wiring (see Journal of Microelectromechanical Systems, Vol. 17, No. 2, pp. 446-452, April 2008). This method is illustrated in FIG. 4. A device substrate 1007 includes multiple devices 1008, and transmits and receives ultrasound waves with each device 1008 as one unit. Each device 1008 includes an upper electrode 1000, a membrane 1001, cavities 1002, and a lower electrode 1003. Adjacent devices 1008 are electrically isolated (separated) from each other for insulation by a groove 1004 formed between their lower electrodes 1003. Each lower electrode 1003 of the device substrate 1007 is connected via a bump 1005 to a circuit board such as an ASIC substrate. The upper electrodes 1000 of the multiple devices 1008 are connected to an upper electrode lead-out portion 1010, which is connected via upper electrode wiring 1009 and another bump 1005 to the ASIC substrate. Because one lower electrode 1003 is electrically isolated from another in this manner, signals can be taken out on a device basis. The method in Journal of Microelectromechanical Systems, Vol. 17, No. 2, pp. 446-452, April 2008 also gives the CMUT flexibility by filling the groove 1004 with polydimethyl siloxane (PDMS) 1006. The groove 1004 provided for device isolation is sealed with resin to prevent foreign matter from falling into the groove 1004, which is effective in preventing dielectric breakdown between the devices 1008.

SUMMARY OF THE INVENTION

The CMUT of Journal of Microelectromechanical Systems, Vol. 17, No. 2, pp. 446-452, April 2008 which seals the groove provided for device isolation with resin has a possibility that the parasitic capacitance between one lower electrode 1003 and another, or between the lower electrode 1003 and the upper electrode wiring 1009, grows larger than in cases where the groove is an unclogged space. On the other hand, a CMUT in which the groove is left as an unclogged space has the risk of foreign matter falling into the groove and causing dielectric breakdown.

In view of the above-mentioned problem, according to the present invention, there is provided an electromechanical transducer including: a plurality of devices each of which includes at least one cell including a first electrode and a second electrode, which face each other across a gap; and an outer frame which extends along the outer periphery of the plurality of devices, in which the first electrode of each of the plurality of devices includes a plurality of portions, which are formed by electrically separating a device substrate with grooves, in which the outer frame includes a part of the device substrate that surrounds the plurality of portions and that is electrically separated from the plurality of portions by the grooves, in which the first electrodes each formed of the plurality of portions are respectively bonded to a plurality of conductive portions of another substrate via a plurality of electrode connection portions, and in which the outer frame is bonded to a corresponding portion of the another substrate via a circular outer frame connection portion, which surrounds the plurality of electrode connection portions.

Further, in view of the above-mentioned problem, according to the present invention, there is provided a method of manufacturing an electromechanical transducer in which a device substrate includes a plurality of devices and an outer frame, and is bonded to another substrate, the plurality of devices each including at least one cell including a first electrode and a second electrode which face each other across a gap, the outer frame extending along an outer periphery of the plurality of devices, the method including: forming grooves in the device substrate and forming the outer frame and a plurality of the first electrodes; forming a plurality of electrode connection portions, which are respectively connected to the plurality of first electrodes, and forming an outer frame connection portion, which extends along the periphery of the plurality of electrode connection portions to form a circular shape and which is connected to the outer frame; and bonding the device substrate and the another substrate via the outer frame connection portion and the plurality of electrode connection portions.

According to the present invention, the outer frame connection portion functions as a sealing material of a space that contains the grooves, whereby the grooves provided for device separation can be sealed while allowing the interior of each groove to remain an unclogged space, and foreign matter can be prevented from falling into the grooves.

Further features of the present invention will become apparent from the following description of exemplary embodiments with reference to the attached drawings.

DESCRIPTION OF THE EMBODIMENTS

Figure 1A:
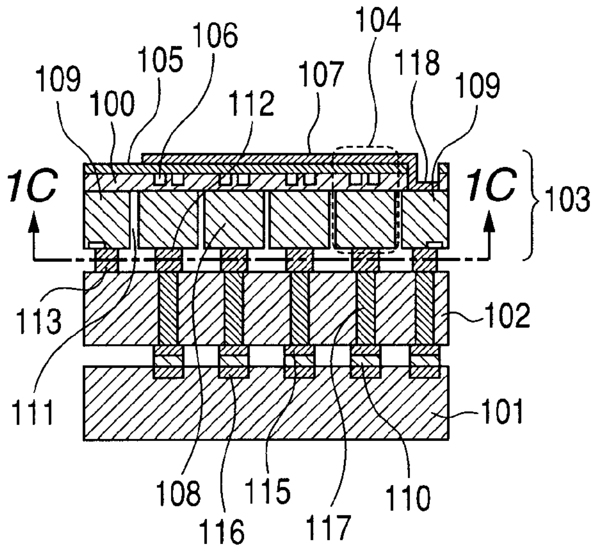
FIGS. 1A, 1B, 1C and 1D are diagrams illustrating the structure of a CMUT as an example of electromechanical transducers to which the present invention can be applied.

Embodiments of the present invention are described below. The important point of an electromechanical transducer and its manufacturing method according to the present invention is that a circular outer frame connection portion is formed on an outer frame of a device substrate, which has multiple portions electrically isolated from one another by grooves, to surround electrode connection portions for connecting the multiple portions. The outer frame is bonded to a corresponding portion of another substrate via the circular outer frame connection portion. The other substrate can be a wafer embedded with electrical through-wafer interconnects (see the embodiments below) having multiple electrical through-wafer interconnects, which are conductive portions, or a circuit board for controlling the electromechanical transducer.

Based on this concept, the basic mode of the electromechanical transducer and its manufacturing method of the present invention are constructed as described in Summary of the Invention. The basic mode can be developed into the following embodiments. The electrode connection portions and the outer frame connection portion can be formed from the same conductive material, which facilitates the manufacture of the electromechanical transducer. The outer frame and a second electrode (upper substrate described later) can be connected electrically and, in this case, the outer frame is bonded to a conductive portion of the corresponding portion of the another substrate via a conductive portion of the circular outer frame connection portion. The entirety of the outer frame connection portion may be a conductive portion, or only a part of the outer frame connection portion may be a conductive portion for electric connection. The grooves can be in a vacuum state or a reduced pressure state, or filled with a gas.

An electromechanical transducer according to embodiments of the present invention and a method of manufacturing the electromechanical transducer according to embodiments of the present invention are described in detail below with reference to the drawings.

First Embodiment

A CMUT according to a first embodiment of the present invention is described as an electromechanical transducer to which the present invention can be applied. FIGS. 1A to 1D illustrate this CMUT. However, the present invention is not limited to CMUTs and is applicable to any electromechanical transducer having a structure similar to that of CMUTs (structure in which a device substrate is partitioned by grooves to form first electrodes of the respective devices). For instance, the present invention is applicable to ultrasound transducers that use distortion, magnetic field, or light (so-called piezoelectric micromachined ultrasonic transducers (PMUTs), magnetic micromachined ultrasonic transducers (MMUTs), etc.). In other words, the present invention is not limited to electromechanical transducers in which the structure above lower electrodes 108 which are first electrodes described later is as described below.

Figure 1B:
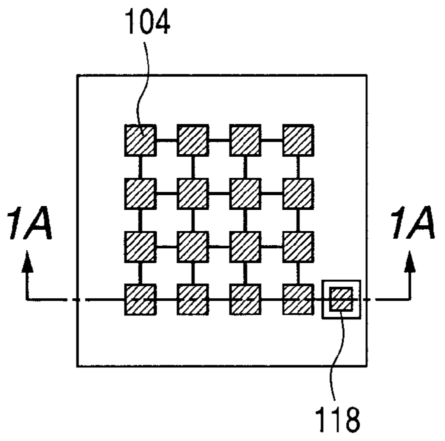
Figure 1C:
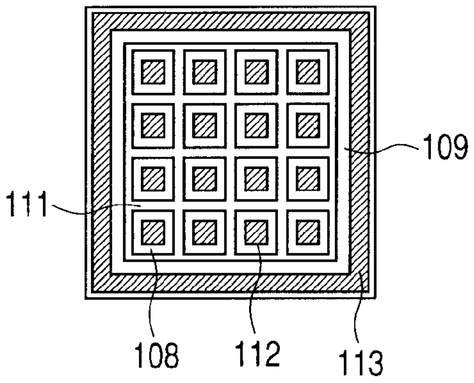
Figure 1D:
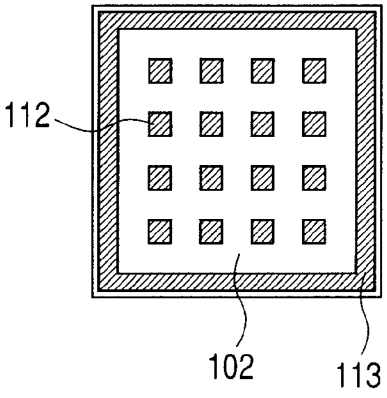

FIG. 1A is a vertical sectional view taken along the line 1A-1A of FIG. 1B. FIG. 1B is a top view of the CMUT. FIG. 1C is a top view on the device substrate side of a cross section taken along the line 1C-1C of FIG. 1A. FIG. 1D is a top view on the wafer embedded with electrical through-wafer interconnects side of a cross section taken along the line 1C-1C of FIG. 1A. The top views, too, are hatched or shaded for easier understanding. The CMUT of this embodiment includes a wafer embedded with electrical through-wafer interconnects 102 and a device substrate 103, and the wafer embedded with electrical through-wafer interconnects 102 is connected to a circuit board 101. As illustrated in FIG. 1A, the device substrate 103 and the circuit board 101 are fixed to each other via the wafer embedded with electrical through-wafer interconnects 102, and the circuit board 101 is placed, not on the same plane (side by side) as the device substrate 103, but below the device substrate 103.

The device substrate 103 includes devices 104, which are arranged two-dimensionally, and an outer frame 109, which runs along the perimeter of the arranged devices 104 to surround all of the devices 104 together. Each device 104 of FIGS. 1A to 1D contains multiple cells which include: an upper electrode 107 serving as a second electrode; a membrane 105; an insulator supporter 100; and the lower electrode 108 serving as the first electrode which faces the second electrode. In each cell, a cavity 106 which is a gap is formed between the upper electrode 107 and the lower electrode 108. In other words, a cell in the present invention includes at least the upper electrode 107 and the lower electrode 108 which face each other across one cavity. The lower electrode 108 in one device 104 is isolated from the lower electrode 108 in another device 104 by a groove 111 formed in the device substrate 103. The cavities 106 in multiple cells of each device 104 may be sealed independently of one another or may communicate with one another. In this manner, each device 104 in this embodiment is constructed by electrically connecting multiple cells in parallel. It is sufficient if each device 104 contains one or more cells, and the number of cells in each device 104, the cell arrangement, and the form of the cavities may be set freely as long as the electromechanical transduction function is implemented. The devices 104 in this embodiment are arranged on the device substrate in four rows by four columns as illustrated in FIG. 1B. However, the number and arrangement of the devices 104 are not limited to those of this embodiment, and as many devices 104 as desired may be used and arranged in a desired pattern. The upper electrode 107 may double as the membrane 105 (vibration film).

The device electrode 103 and the wafer embedded with electrical through-wafer interconnects 102 are fixed to each other and electrically connected to each other via lower electrode connection portions 112, which are electrode connection portions, and an outer frame connection portion 113. As illustrated in FIG. 1C, the outer frame connection portion 113 is formed on the outer frame 109 to have a closed circular shape. The outer frame connection portion 113 is also formed on the wafer embedded with electrical through-wafer interconnects 102 to have a closed circular shape as illustrated in FIG. 1D. The lower electrode connection portions 112 and the outer frame connection portion 113 are preferably formed from the same conductive material because then the two types of connection portions 112 and 113 can be formed in one bonding step.

The wafer embedded with electrical through-wafer interconnects 102 has multiple electrical through-wafer interconnects 117, which are conductive portions penetrating the wafer embedded with electrical through-wafer interconnects 102 from a surface to be bonded to the device substrate 103 to a surface on the side of the circuit board 101. Signals from the lower electrodes 108 are transmitted to the circuit board 101 via the lower electrode connection portions 112 and via under bump metal portions 115, which are connected electrically via the electrical through-wafer interconnects 117 to the lower electrode connection portions 112. Signals from the upper electrode 107, too, are transmitted to the circuit board 101 via an upper electrode lead-out portion 118, the outer frame 109, the outer frame connection portion 113, the electrical through-wafer interconnects 117, the under bump metal portions 115, and other components. In short, the outer frame 109 and the outer frame connection portion 113 have the role of upper electrode wiring which electrically connects the upper electrode 107 to the circuit board 101. The circuit board 101 includes a processing circuit (not shown) for processing signals and electrode pads 116, which are conductive portions. The circuit board 101 and the wafer embedded with electrical through-wafer interconnects 102 are bonded to each other by bumps 110.

The electrical through-wafer interconnects 117 of the wafer embedded with electrical through-wafer interconnects 102 preferably penetrate the wafer embedded with electrical through-wafer interconnects 102 from the surface to be bonded to the device substrate 103 to the surface on the side of the circuit board 101. This is because, if formed on the surface of the wafer embedded with electrical through-wafer interconnects 102 that is bonded to the device substrate 103, wiring lines of the lower electrode 108 overlap with the outer frame connection portion 113. The arrangement, number, and diameter of the electrical through-wafer interconnects 117 are not limited to those in FIGS. 1A to 1D, and as many electrical through-wafer interconnects 117 as desired can be used and arranged in a desired pattern. The material of the electrical through-wafer interconnects 117 is at least one type of metal selected from the group consisting of Al, Cr, Ti, Au, Pt, Cu, Ag, Fe, Ni, and Co. The wafer embedded with electrical through-wafer interconnects 102 is formed from an insulating material, preferably, one having a relative dielectric constant of 3.8 or more and 10 or less, a Young's modulus of 5 GPa or more, and a thermal expansion coefficient three times the thermal expansion coefficient of the device substrate 103 or less. A relative dielectric constant of 3.8 or more and 10 or less ensures favorable insulation performance and a Young's modulus of 5 GPa or more enhances the rigidity and improves the mechanical strength more. A thermal expansion coefficient three times the thermal expansion coefficient of the device substrate 103 or less reduces the warping of the electromechanical transducer from heat during the manufacture process or in use. Specifically, when the device substrate 103, namely, the lower electrodes 108 and the outer frame 109 are formed from silicon (thermal expansion coefficient: 2.55 to 4.33 ppm/K), the wafer embedded with electrical through-wafer interconnects 102 which is a relay substrate is preferably formed from borosilicate glass (thermal expansion coefficient: 3.2 to 5.2 ppm/K).

Each groove 111 is formed to reach the bottom surface of the supporter 100 from a surface of the device substrate 103 that is bonded to the wafer embedded with electrical through-wafer interconnects 102. The shape (in section) of the groove 111 is not particularly limited. The groove 111 is preferably in vacuum or filled with a gas in order to reduce the parasitic capacitance. The gas to fill the groove 111 is desirably air, particularly desirably, nitrogen or argon. This reduces a change with time of the groove 111. The lower electrode connection portions 112 and the outer frame connection portion 113 are preferably thick in order to prevent the warping of the substrates and the resultant bonding error. However, the ease of machining is preferably taken into consideration in setting the thickness of the lower electrode connection portions 112 and the outer frame connection portion 113. Specifically, the thickness of the connection portions 112 and 113 is desirably 100 nm or more and 1,000 nm or less, more desirably, 200 nm or more and 600 nm or less.

The shape (in section) of the lower electrode connection portions 112 is not particularly limited, but is preferably smaller than the shape in section of the lower electrodes 108 in order to isolate the devices 104 from one another. Specifically, in the case where the lower electrode connection portions 112 each have a square shape in section, the length of one side is desirably 10 μm or more and 3,000 μm or less, more desirably, 100 μm or more and 2,000 μm or less, particularly desirably, 1,000 μm or more and 2,000 μm or less. The outer frame connection portion 113 preferably has a closed circular shape (various shapes including a square and a ring can be employed) in order to prevent contaminants from entering the grooves 111, which are formed in the device substrate 103. In order to isolate the outer frame connection portion 113 from the arranged devices 104, the width of the outer frame connection portion 113 is preferably the width of the outer frame 109 or less. The lower electrode connection portions 112 and the outer frame connection portion 113 that are used in this embodiment are formed from at least one type of metal selected from the group consisting of Zn, Ti, Au, Ag, Cu, Sn, and Pb.

The operation principle of the CMUT constructed as described above is described. In receiving ultrasound waves, for example, the membrane 105 is displaced and changes the gap between the upper electrode 107 and the relevant lower electrode 108. The amount of the resultant change in capacitance is detected and subjected to signal processing by the signal processing circuit of the circuit board 101, to thereby obtain an ultrasound image. To transmit ultrasound waves, a voltage is applied from the circuit board 101 to the upper electrode 107 or to the relevant lower electrode 108 to cause the membrane 105 to vibrate and emit ultrasound waves. The CMUT of this embodiment can be manufactured by a bonding type method, a surface type method, or other methods. In a bonding type method, a membrane is formed by, for example, creating a cavity in a silicon substrate and bonding an SOI substrate to the silicon substrate (see a second embodiment described later). In a surface type method, a membrane is formed on a sacrificial layer, which is etched later to form a cavity.

According to this embodiment, the outer frame connection portion 113 which blocks off the space between the device substrate 103 and the wafer embedded with electrical through-wafer interconnects 102 for each device aggregation (aggregation of as many devices 104 as desired) functions as a sealing material, and thus seals the grooves 111 provided for the isolation of the devices 104 while allowing the interior of each groove 111 to remain an unclogged space. Foreign matter is accordingly prevented from falling into the grooves 111. This lowers the probability of dielectric breakdown between the devices 104. The grooves 111 can be sealed by setting the interior of the grooves 111 to vacuum or filling the interior of the grooves 111 with a gas, which further reduces the parasitic capacitance than in cases where grooves are filled with resin. In addition, because shavings or the like are prevented from falling into the grooves 111 during the manufacture process of the electromechanical transducer, particularly in a dicing step, the probability of dielectric breakdown between the devices 104 is lowered. The wafer embedded with electrical through-wafer interconnects 102 may be omitted and the device substrate 103 may be bonded directly to the circuit board 101. In this case, the lower electrode connection portions 112 and the outer frame connection portion 113 are bonded to their respective corresponding portions (e.g., electrode pads 116) of the circuit board 101.

Second Embodiment

Figure 2A:
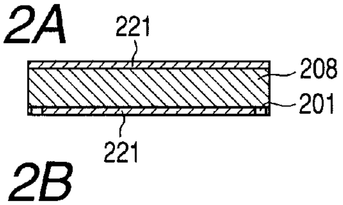
FIGS. 2A, 2B, 2C, 2D, 2E, 2F, 2G, 2H, 2I, 2J, 2K, 2L, 2M and 2N are sectional views illustrating a method of manufacturing a CMUT according to a second embodiment.
Figure 2B:
Figure 2C:
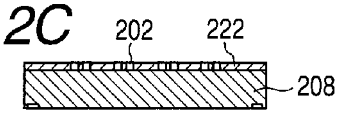
Figure 2D:
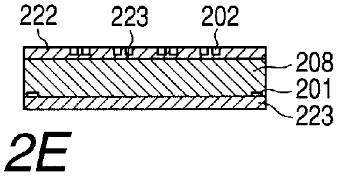
Figure 2E:
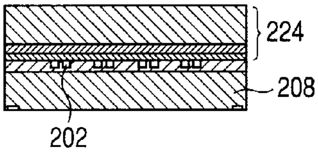
Figure 2F:
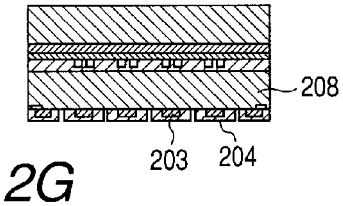
Figure 2G:
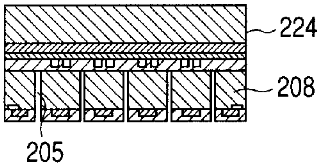
Figure 2H:
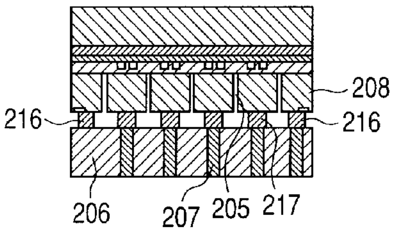
Figure 2I:
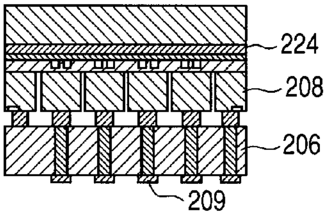
Figure 2J:
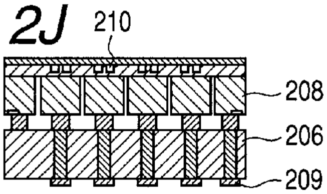
Figure 2K:
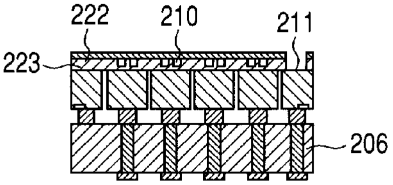
Figure 2L:
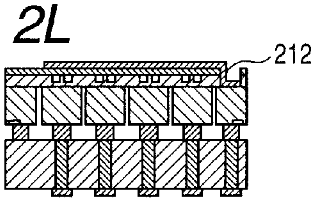

The second embodiment deals with a method of manufacturing a CMUT in which a device substrate and a wafer embedded with electrical through-wafer interconnects are bonded via an outer frame connection portion and lower electrode connection portions. FIGS. 2A to 2N which illustrate the process flow of this embodiment illustrate devices found in the vertical sectional view of FIG. 1A, but devices in the rest of the CMUT are also manufactured in the same manner.

A Si substrate 208 which serves as a device substrate is prepared first. The Si substrate 208 later constitutes lower electrodes and therefore is preferably low in resistivity. The Si substrate 208 used in this embodiment has a specific resistance of less than 0.02 Ω·cm. Oxide films 221 are formed on the Si substrate 208. Alignment marks 201 are formed by photolithography on the rear side of the substrate 208. The alignment marks 201 are formed by etching the rear side oxide film 221 with buffered hydrofluoric acid (BHF) with a resist pattern as a mask. The resist is then removed with the use of acetone and isopropyl alcohol (IPA). This state is illustrated in FIG. 2A. Next, as illustrated in FIG. 2B, the oxide films 221 formed for forming the alignment marks are removed with BHF in order to create cavities.

To create the cavities, an oxide film 222 is formed by thermal oxidation. A resist pattern for a cavity pattern is further formed on the front side of the substrate 208 by photolithography. With the resist pattern as a mask, the oxide film 222 is etched with BHF to form cavities 202. The Si substrate 208 preferably has a thickness of 100 μm or more and 625 μm or less. The oxide film 222, where the cavities 202 are formed, preferably has a thickness of 2 μm or less. This state is illustrated in FIG. 2C. The Si substrate 208 next undergoes thermal oxidation again in order to insulate the bottom surfaces of the cavities 202. As a result, oxide films 223 are formed to a thickness of, for example, 1,500 Å. In this embodiment, the oxide film 222 and the front side oxide film 223 constitute the supporter 100 (see FIG. 1A). This state is illustrated in FIG. 2D.

An SOI substrate 224 is bonded next in order to form a membrane. The bonding step is as follows. First, a device layer which is a bonding surface of the SOI substrate 224 and the Si substrate 208 are treated by plasma treatment. The plasma used is one of $N_2$, $O_2$, and Ar. The Si substrate 208 and the SOI substrate 224 are next positioned relative to each other by aligning orientation flats or notches together. The substrates are then bonded in a vacuum chamber at a temperature of, for example, 300° C. and a load of, for example, 500 N. The cavities 202 are created in this step. Lastly, the oxide film 223 that is on the rear side of the Si substrate 208 is removed by etching with the use of BHF. This state is illustrated in FIG. 2E.

Next, to form the outer frame connection portion and the lower electrode connection portions, a Ti layer and a Au layer are formed to a thickness of 10 nm and a thickness of 500 nm, respectively, on the lower electrode side of the device substrate and on the device substrate side of a wafer embedded with electrical through-wafer interconnects. Photolithography and a Ti etchant and a Au etchant are used to form a Ti/Au pattern 203, which is patterned after the shapes of the outer frame connection portion and the lower electrode connection portions. This step is for forming the multiple lower electrode connection portions, which are respectively connected to multiple lower electrodes, and the outer frame connection portion, which runs along the perimeter of the arranged multiple lower electrode connection portions to form a circular shape and which is connected to the outer frame. To further form grooves for device isolation, a Cr film is formed and a Cr pattern 204 patterned after the shapes of the outer frame 109 and the lower electrodes 108 (see FIG. 1A) is formed by photolithography and wet etching of the Cr film. This state is illustrated in FIG. 2F. Deep-RIE is used next to dry-etch the Si substrate 208 and thereby form grooves 205 for device isolation as illustrated in FIG. 2G. This step is for forming the grooves in the device substrate and forming the outer frame and the multiple lower electrodes.

Next, the Si substrate 208 and a wafer embedded with electrical through-wafer interconnects 206 are bonded together by Au—Au bonding while at the same time an outer frame connection portion 216 and lower electrode connection portions 217 are formed. The Si substrate 208 and the wafer embedded with electrical through-wafer interconnects 206 are bonded in a vacuum atmosphere or a reduced pressure atmosphere, to thereby seal the grooves 205 with the interior of the grooves 205 in a vacuum state or a reduced pressure state. FIG. 2H is a vertical sectional view of the Si substrate 208 after the wafer embedded with electrical through-wafer interconnects 206 is bonded thereto. This step is for bonding the device substrate and the wafer embedded with electrical through-wafer interconnects via the outer frame connection portion and the multiple lower electrode connection portions. The wafer embedded with electrical through-wafer interconnects 206 is, for example, a borosilicate glass substrate in which through holes are formed in advance by sand blasting or the like and electrical through-wafer interconnects 207 are buried in the through holes. In bonding the substrates, the substrates are positioned such that the central axes of the electrical through-wafer interconnects 207 coincide with the central axes of the devices 104 (see FIG. 1A). A known alignment system (such as EVG 620, a product of EV Group (EVG)) can be used to position the substrates with a precision of at least ±5 μm.

Under bump metal is formed next on the wafer embedded with electrical through-wafer interconnects 206. A metal mask on which the pattern of the under bump metal is formed is placed on the entire surface of the wafer embedded with electrical through-wafer interconnects 206, and a Ti/Cu/Au film is formed by evaporation. Under bump metal portions 209 are thus formed on the wafer embedded with electrical through-wafer interconnects 206 as illustrated in FIG. 2I. Next, the substrate supporting layer and embedded oxide film of the SOI substrate 224 are removed by etching. For example, the substrate supporting layer of the SOI substrate 224 is removed by etching through Deep-RIE, and the embedded oxide film is removed by etching with the use of BHF. A membrane 210 is thus formed as illustrated in FIG. 2J. An upper electrode lead-out portion 211 is formed next. Here, a resist pattern of the upper electrode lead-out portion 211 is formed by photolithography on a surface of the membrane 210. With the resist as a mask, the membrane 210 is etched by dry etching with the use of $CF_4$ gas or $SF_6$ gas. Similarly, the resist is used as a mask to etch the films 222 and 223, which constitute the supporter, by dry etching with the use of $CF_4$ gas or $CHF_3$ gas. This state is illustrated in FIG. 2K.

An upper electrode 212 is formed next. An Al film, for example, is formed by evaporation on a surface of the membrane 210. Here, a resist pattern of the upper electrode 212 is formed by photolithography on the surface where the Al film has been formed by evaporation. The resist pattern is used as a mask to wet-etch the Al film as illustrated in FIG. 2L.

Figure 2M:
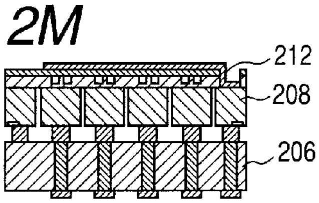
Figure 2N:
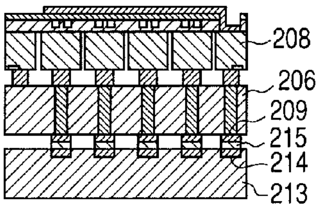
Figure 3A:
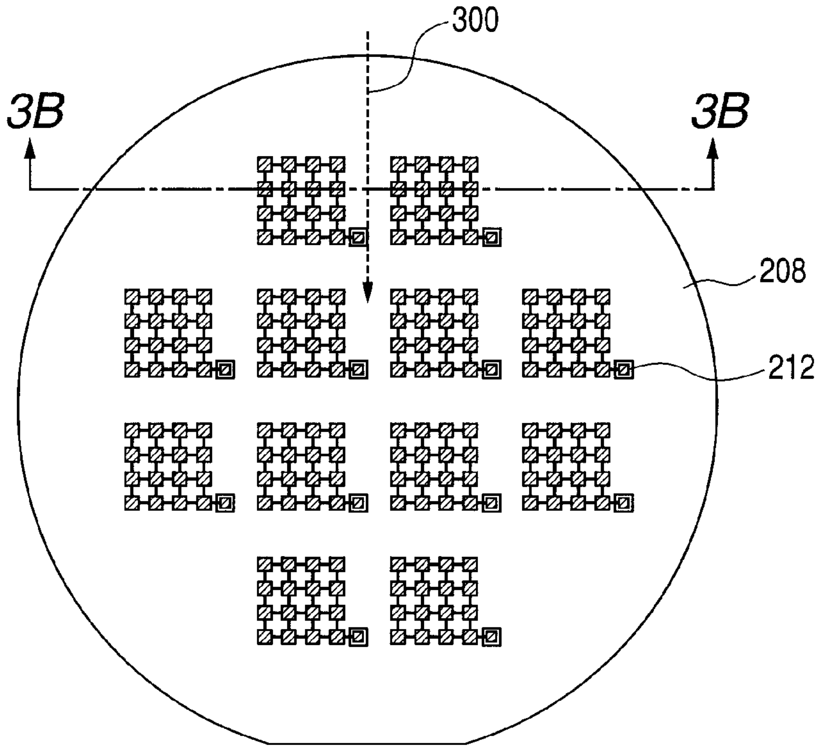
FIGS. 3A and 3B are diagrams illustrating the method of manufacturing the CMUT according to the second embodiment.
Figure 3B:
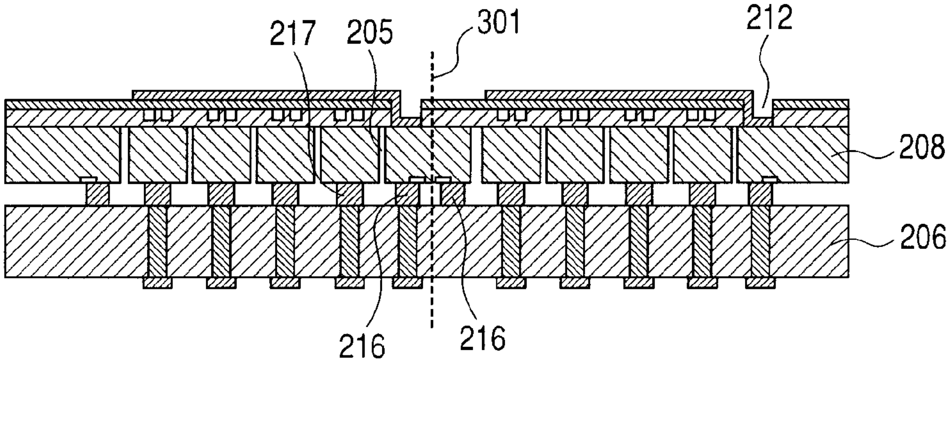
Figure 4:
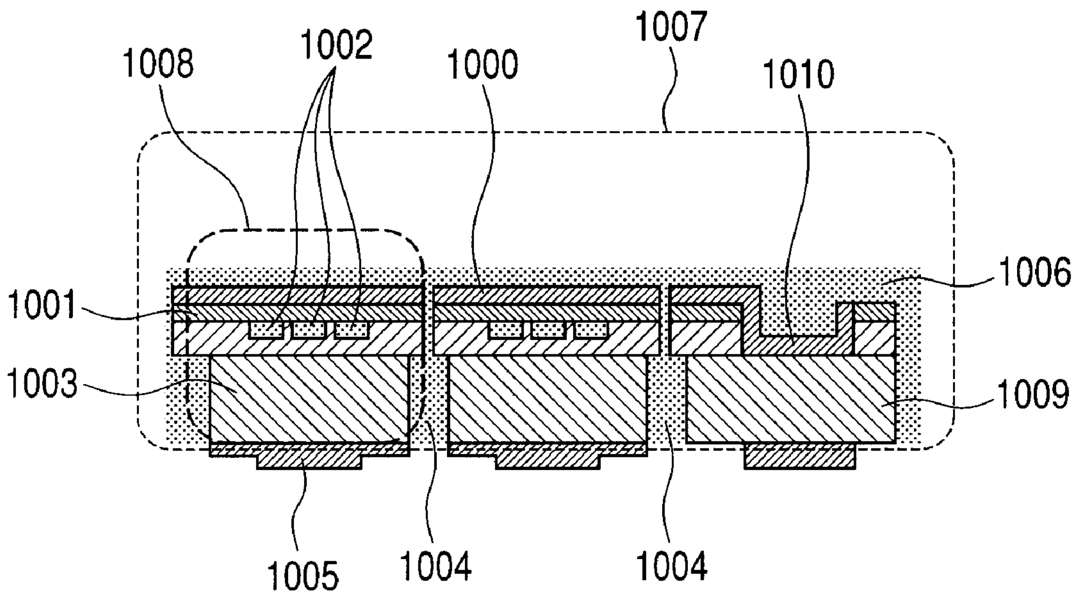
FIG. 4 is a schematic sectional view illustrating a conventional CMUT.

In the state of FIG. 2M, the devices are cut out of the wafer by dicing. The dicing step of FIG. 2M is described with reference to FIGS. 3A and 3B. FIG. 3A is a top view of the wafer in the step of FIG. 2M. FIG. 3B is a vertical sectional view taken along the line 3B-3B in FIG. 3A. When the wafer is diced as indicated by an arrow 300, a dicing blade cuts along a chain line 301. At that time, coolant water for the dicing is prevented from penetrating the lower electrode connection portions 217 and the grooves 205 owing to the presence of the outer frame connection portion 216. Lastly, the wafer embedded with electrical through-wafer interconnects 206 and a circuit board 213 are bonded. The bonding employs, for example, Pb-free solder and the boards 206 and 213 are soldered by reflow soldering. Solder paste obtained by mixing solder powder and flux is printed on electrode pads 214 of the circuit board 213. As illustrated in FIG. 2N, the electrode pads 214 of the circuit board 213 and the under bump metal portions 209 are then positioned relative to each other and the boards 206 and 213 are bonded together by solder 215. The CMUT can thus perform signal processing for transmitting and receiving ultrasound waves.

By connecting the device substrate and the wafer embedded with electrical through-wafer interconnects via the outer frame connection portion that has the closed circular shape as in this embodiment, the outer frame connection portion functions as a sealing material and prevents contaminants from entering grooves for isolating lower electrodes from one another. The probability of dielectric breakdown between devices is lowered in this manner. This also keeps the interior of the grooves in a vacuum state or a reduced pressure state, and the parasitic capacitance is accordingly smaller than in cases where the space between devices is sealed with resin. The outer frame connection portion also prevents the penetration of coolant water in the dicing step, which is one of the manufacture steps. As a result, shavings or other contaminants are prevented from entering the grooves and the probability of dielectric breakdown between devices is lowered.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-261592, filed Nov. 17, 2009, which is hereby incorporated by reference herein in its entirety.

What is claimed is:

1. An electromechanical transducer, comprising:

a plurality of devices each comprising at least one cell comprising a first electrode and a second electrode provided so as to face each other across a gap; and an outer frame extending along an outer periphery of the plurality of devices, wherein the first electrode of each of the plurality of devices comprises one of a plurality of portions formed by electrically separating a device substrate with grooves, wherein the outer frame comprises a part of the device substrate that surrounds the plurality of portions and that is electrically separated from the plurality of portions by the grooves, wherein the first electrodes comprising the plurality of portions are respectively bonded to a plurality of conductive portions of another substrate via a plurality of electrode connection portions, and wherein the outer frame is bonded to a corresponding portion of the another substrate via a circular outer frame connection portion which surrounds the plurality of electrode connection portions.

2. The electromechanical transducer according to claim 1, wherein the another substrate comprises a wafer embedded with electrical through-wafer interconnects having a plurality of electrical through-wafer interconnects, which serve as the plurality of conductive portions.

3. The electromechanical transducer according to claim 1, wherein the another substrate is a circuit board for controlling the electromechanical transducer.

4. The electromechanical transducer according to claim 1, wherein the plurality of electrode connection portions and the circular outer frame connection portion are formed of a same conductive material.

5. The electromechanical transducer according to claim 1, wherein the outer frame and the second electrode are electrically connected to each other, and the outer frame is bonded to the plurality of conductive portions of the corresponding portion of the another substrate via a conductive portion of the circular outer frame connection portion.

6. The electromechanical transducer according to claim 1, wherein the grooves are in vacuum or filled with a gas.

* * * * *